United States Patent [19]
Uda et al.

[11] Patent Number: 5,585,676
[45] Date of Patent: Dec. 17, 1996

[54] IC CHIP FOR DIFFERENT TYPE IC PACKAGES

[75] Inventors: Hisanori Uda; Tetsuro Sawai; Toshikazu Imaoka; Toshikazu Hirai; Yasoo Harada, all of Moriguchi, Japan

[73] Assignee: Sanyo Electric Co., Ltd., Osaka, Japan

[21] Appl. No.: 228,654

[22] Filed: Apr. 18, 1994

[30] Foreign Application Priority Data

Apr. 20, 1993 [JP] Japan ................................ 5-093251

[51] Int. Cl.⁶ ................................................. H01L 23/48
[52] U.S. Cl. ........................ 257/786; 257/692; 257/697
[58] Field of Search ................................ 257/778, 776, 257/786, 697, 734, 692, 693

[56] References Cited

U.S. PATENT DOCUMENTS

| | | | |
|---|---|---|---|
| 4,860,087 | 8/1989 | Matsubara et al. | 257/778 |
| 5,036,163 | 7/1991 | Spielberger | 257/697 |
| 5,165,067 | 11/1992 | Wakefield | 257/786 |
| 5,311,043 | 5/1994 | Stockmaier | 257/786 |

FOREIGN PATENT DOCUMENTS

| | | | |
|---|---|---|---|
| 63-117437 | 5/1988 | Japan . | |
| 4-122604 | 4/1992 | Japan . | |
| 4-290259 | 10/1992 | Japan | 257/691 |
| 5-57457 | 3/1993 | Japan . | |

OTHER PUBLICATIONS

GaAs MESFET Circuit Design (Artech House 1988) pp. 497–509.
Advanced GaAs MMIC Technology (Microwave Exhibition & Publisher Ltd. 1993) pp. 277–280.

*Primary Examiner*—William Mintel
*Assistant Examiner*—Roy Potter
*Attorney, Agent, or Firm*—Darby & Darby, P.C.

[57] ABSTRACT

An IC chip characterized in that at least two input pads and at least two output pads are respectively disposed symmetrical to each other about the center of the IC chip, at least two input/output pads are disposed symmetrical to each other about the center, at least one supply voltage pad is disposed in each of four equal sections formed by longitudinally and laterally dividing the IC chip, and at least one control voltage pad is disposed in each of these four sections. The IC chip can be connected by bonding to various types of IC packages having different configurations of the pins only by mounting in a proper direction without causing the bonding wires to bridge over the other constituent elements or to cross each other.

16 Claims, 10 Drawing Sheets

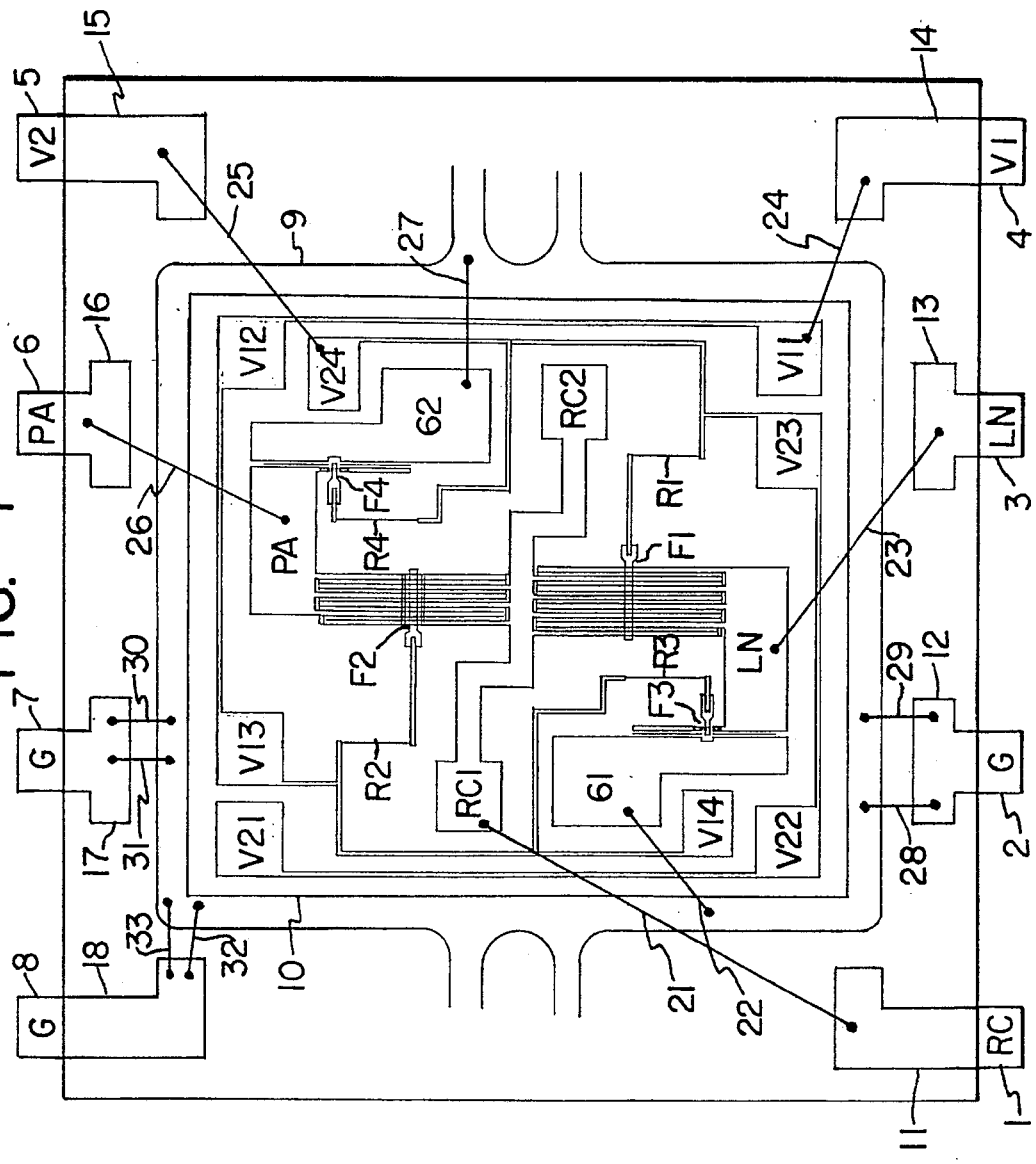

IC CHIP FOR DIFFERENT TYPE IC PACKAGES

BACKGROUND OF THE INVENTION

1. Field of the Invention

The present invention relates to an IC chip having a pad layout of high versatility.

2. Description of the Related Art

In an IC device including an integrated circuit, pads of an IC chip and pins of an IC package are connected to each other by bonding in order to draw a bonding wire out of the IC chip. When this bonding wire straddles over a constituent element of the IC chip, or when the bonding wire intersects another bonding wire, malfunction of the IC device is caused. Therefore, it is necessary to design the IC device in consideration of these points. Accordingly, the pins of the IC package are arranged according to the configuration of the constituent elements of the IC chip, or the constituent elements of the IC chip are arranged according to the configuration of the pins in the IC package. Therefore, in a conventional IC device, one type of IC chip design approximately corresponds to one type of an IC package.

Therefore, when a plurality of IC packages respectively having different configurations of pins are required to mounted IC chips having the same circuit configuration, it is necessary to design and manufacture IC these chips with the same number of different circuit layouts as that of the pin configurations of the IC packages. For example, in order to produce six different pin configurations, six different circuit patterns are required to be formed on one wafer. The number of each circuit pattern obtained in this manner is only ⅙ of the number obtained by forming only one pattern on a wafer. When different numbers of the respective circuit patterns are desired, the yield is lowered. Or, when one circuit pattern is formed on one wafer, six different types of wafers must be produced. Thus, there were many problems in making an IC chip having plural kinds of circuit patterns.

SUMMARY OF THE INVENTION

The invention is devised to solve such problems, and it is hence a primary object thereof to provide an IC chip having one kind of circuit layout and is adaptable to plural types of pin configurations of IC packages. This is accomplished by disposing various correlated pads symmetrically about the center or in each of four sections formed by dividing the IC chip longitudinally and laterally.

In the IC chip of the invention, input pads and output pads are respectively arranged point-symmetrically to each other about the center of the IC chip, or at least two input/output pads are disposed point-symmetrically to each other about the center, or at least one source voltage pad is disposed in each of four equal sections formed by longitudinally and laterally dividing the IC chip. Alternatively, or at least one control voltage pad is disposed in each of the four sections. Or a combination of these arrangements can be used. Therefore, in connecting the pins of an IC package and the pads of an IC chip, each of the pins is connected to one of the closest pads selected so as not to allow the bonding wires to cross each other.

For example, when the IC package has the input pin and the output pin on the same side thereof, and has the input/output pin for inputting and outputting on the same side or the opposite side, or when the IC package has the input pin and the output pin on the opposing sides, respectively, and has the input/output pin on either of the opposing sides, the bonding wires can be connected by bonding with the IC chip of the invention mounted on the IC package.

Alternatively, when the IC package has the source voltage pin for supplying a source voltage and the control voltage pin for supplying a control voltage on either of the opposing sides, the IC chip of the invention can be mounted on the IC chip without causing the bonding wires to cross those for inputting and outputting signals.

Furthermore, when the IC package has the input pin, the output pin, the input/output pin, the source voltage pin and the control voltage pin on either of the opposing sides, the IC chip of the invention can be mounted on the IC chip without causing the bonding wires to cross those for inputting and outputting signals. In this manner, even in the case of the bonding connection of the IC packages differing in the pin configurations, the IC chip of the invention can be connected only by mounting in a proper direction without causing the bonding wires to cross over the other constituent elements or to cross each other. Therefore, it is not necessary to change the circuit layout of an IC chip according to the pin configuration of the IC package to be connected. It is also possible to adjust the IC chip to the pin configuration of an existing IC package. Further, the pin configuration of an IC package can be determined by the request from a user.

The above and further objects and features of the invention will more fully be apparent from the following detailed description with accompanying drawings.

BRIEF DESCRIPTION OF THE DRAWINGS

FIG. 4 is a plan view of a bonding wire connected to the IC chip of FIG. 2.

DESCRIPTION OF THE PREFERRED EMBODIMENTS

Figure 1:
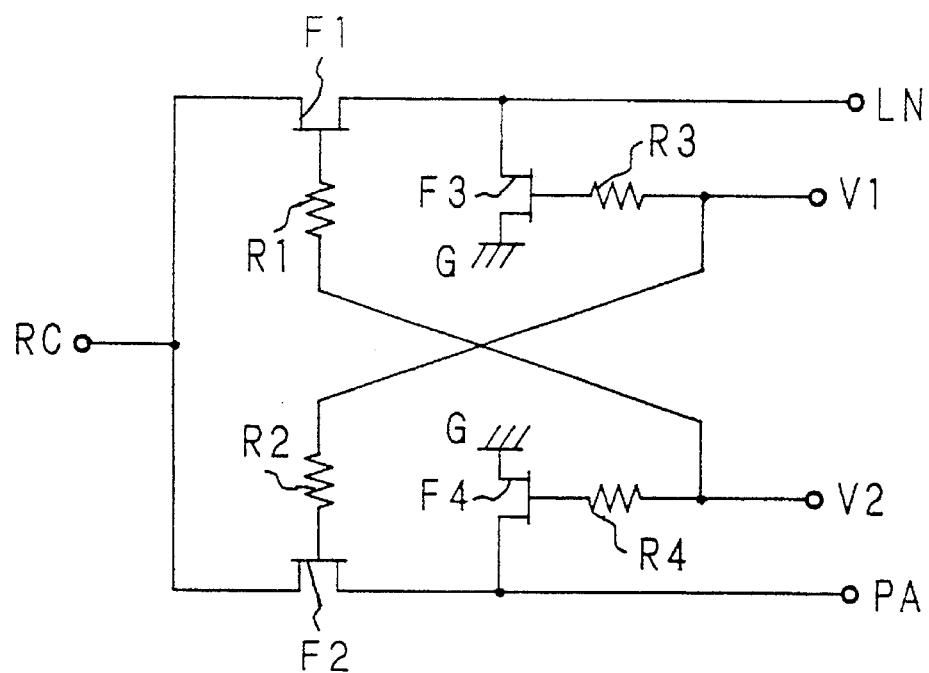
FIG. 1 is a circuit diagram of an MMIC switch.

Referring now to the drawings, the embodiments of the invention are described in detail below.

FIG. 1 is a circuit diagram of an MMIC (monolithic microwave integrated circuit) switch. A high frequency signal input from an input/output terminal RC is output to an output terminal LN via an FET (field effect transistor) F1. Between the output terminal LN and a ground G, an FET F3 is provided. A high frequency signal input from an input terminal PA is output to the input/output terminal RC via an FET F2. Between the input terminal PA and a ground G, an FET F4 is provided. The gate of the FET F1 is connected to a control voltage terminal V2 via a resistance R1, and the gate of the FET F4 is connected to the control voltage terminal V2 via a resistance R4. The gate of the FET F2 is connected to a control voltage terminal V1 via a resistance R2, and the gate of the FET F3 is connected to the control voltage terminal V2 via a resistance R3.

The four FETs F1, F2, F3 and F4 illustratively are all N-channel depletion type MES (metal semiconductor) FETs, and are turned ON when a 0 V signal is applied to the gate, and turned OFF when −3 V is applied to the gate. The control voltage terminal V1 is a terminal for applying a control voltage for controlling the FETs F2 and F3, and the control voltage terminal V2 is a terminal for applying a control voltage for controlling the FETs F1 and F4.

The operation of such an MMIC switch is described below.

When −3 V is applied to the control voltage terminal V1 and 0 V to the control voltage terminal V2, the FETs F1 and F4 are turned ON, and the FETs F2 and F3 are turned OFF. Therefore, a high frequency signal input from the input/output terminal RC is output to the output terminal LN. Although the FET F2 is OFF, a slight leakage current flows, since and the FET F4 is ON, the current flows to ground G, and does not flow to the input terminal PA.

When 0 V is applied to the control voltage terminal V1 and −3 V to the control voltage terminal V2, the FETs F2 and F3 are turned ON, and the FETs F1 and F4 are turned OFF. Therefore, a high frequency signal input from the input terminal PA is output to the input/output terminal RC. Although the FET F1 is OFF, a slight leakage current flows, and the since FET F3 is ON, the current flows to ground G, and does not flow to the output terminal LN.

Figure 2:
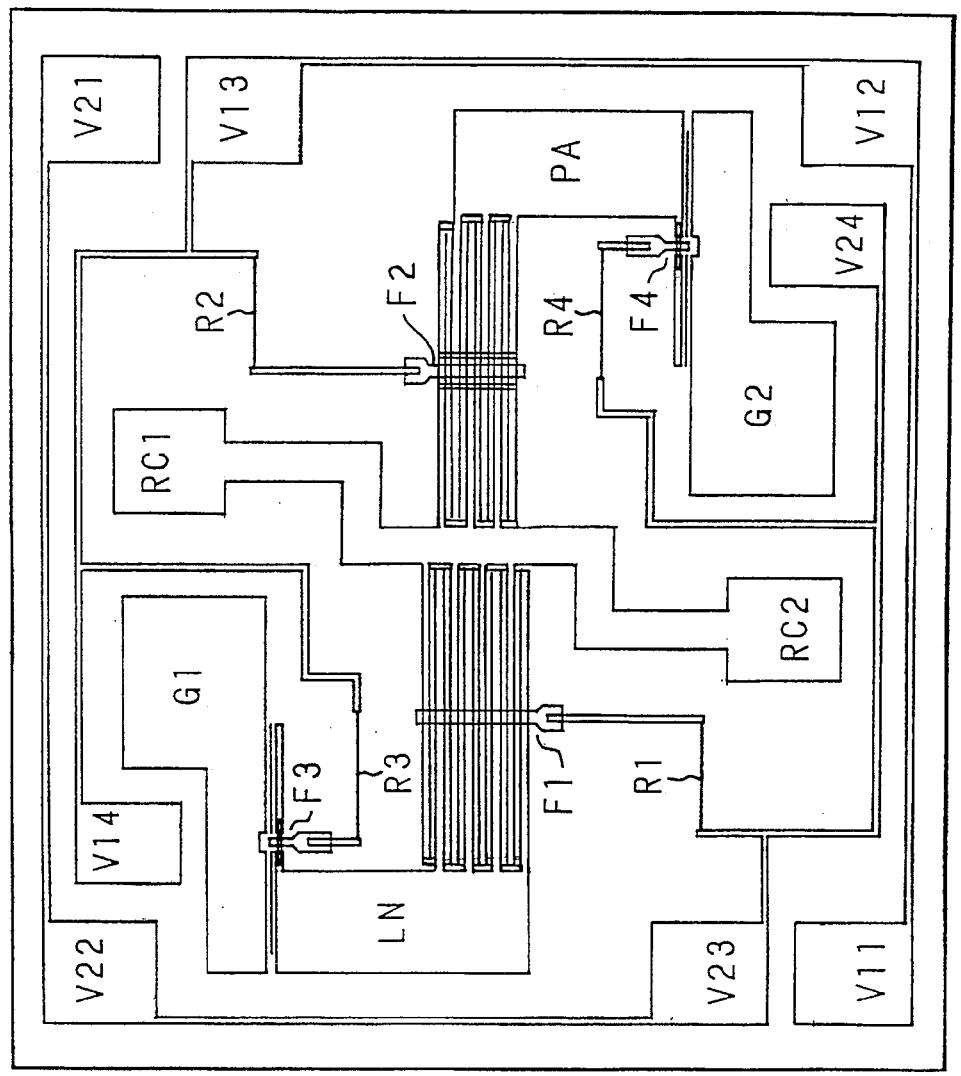
FIG. 2 is a layout diagram of an IC chip of the invention.

FIG. 2 is a layout diagram of an IC chip of the invention used for the MMIC switch circuit of FIG. 1. The location of each element is described with respect to the layout shown in FIG. 2. In the diagram of FIG. 2, four pads V11, V12, V13 and V14 are pads corresponding to the control voltage terminal V1 of FIG. 1. The configuration of the IC chip will now be described referring to FIG. 2. The pad V11 is located at the lower left corner of the chip, the pad V12 is located at the lower right corner, the pad V13 is slightly below the upper right corner, and the V14 is slightly to the right of the upper left corner. The connection wire, or trace, from the pad V11 runs to the right along the lower side and is connected to the pad V12. It then runs upward along the chip's right side and is connected to the pad V13. It then runs to the left, upward then to the left along the upper side, and is connected to the pad V14.

Four pads V21, V22, V23 and V24 are pads corresponding to the control voltage terminal V2 of FIG. 1. The pad V21 is disposed at the upper right corner, the pad V22 at the upper left corner, the pad V23 slightly above the lower left corner, and the pad V24 slightly left of the lower right corner. The bonding wire from the pad V21 runs to the left along the chip's upper side to be connected to the pad V22, then runs downward along the left side to be connected to the pad V23, and runs to the right, downward and then to the right along the lower side to be connected to the pad V24. The four pads V11, V12, V13 and V14 and the connection wire therebetween, and the four pads V21, V22, V23 and V24 and the connection wire therebetween are disposed to be point-symmetrical about, the center of the IC chip.

Two pads RC1 and RC2 are pads corresponding to the input/output terminal RC of FIG. 1. The pad RC1 is located inside of the connection wires of the two pads V21 and V13 slightly on the right side of the chip center below the upper side, and the pad RC2 is located inside of the connection wires of the two pads V11 and V23 slightly on the left side of the chip center above the lower side. The pads RC1 and RC2 are arranged and connected so as to be point-symmetrical to each other about the center of the IC chip. Two pads G1 and G2 are pads corresponding to the ground G of FIG. 1. The pad G1 is located inside of the connection wires of the two pads V14 and V22 slightly on the left side of the chip center below the upper side, and the pad G2 is located inside of the connection wires of the two pads V12 and V24 slightly on the right side of the chip center above the lower side. The pads G1 and G2 are disposed so as to be point-symmetrical to each other about the center of the IC chip.

A pad LN is a pad corresponding to the output terminal LN of FIG. 1, and is disposed inside of the connection wire between the pads V22 and V23 and slightly in the chip upper portion along the left side. A pad PA is a pad corresponding to the input terminal PA of FIG. 1, and is disposed inside of the connection wire between the pads V12 and V13 and slightly in the chip lower portion along the right side. The pads LN and PA are arranged so as to be point-symmetrical to each other about the center of the IC chip.

Thus, all the pads are either in contact with or in the vicinity of any of the sides of the IC chip. Four FETs F1, F2, F3 and F4 correspond respectively to the FETs F1, F2, F3 and F4 of FIG. 1, and the gate width of the FET F1 and the gate width of the FET F2 are different from each other Four resistances R1, R2, R3 and R4 correspond respectively to the resistances R1, R2, R3 and R4 of FIG. 1.

The FET F1 is disposed on the left side of the chip center, and the FET F2 is disposed on the right side of the center. When the IC chip is longitudinally and laterally divided into four equal sections, the FET F3 is disposed in the upper left section, and the FET F4 is disposed in the lower right section. The resistance R1 is disposed in the lower left section, and the resistance R2 is in the upper right section. The resistance R3 is in the upper left section between the FETs F1 and F3, and the resistance R4 is in the lower right section between the FETs F2 and F4. The four FETs F1, F2, F3 and F4, and the four resistances R1, R2, R3 and R4 are located in the vicinity of the center of the IC chip.

The drain of the FET F1 is connected to the pads RC1 and RC2, its gate is connected to the pads V21, V22, V23 and V24 via the resistance R1, and its source is connected to the pad LN. The drain of the FET F2 is connected to the pads RC1 and RC2, its gate is connected to the pads V11, V12, V13 and V14 via the resistance R2, and its source is connected to the pad PA. The drain of the FET F3 is connected to the pad LN, its gate is connected to the pads V14, V13, V12 and V11 via the resistance R3, and its source is connected to the pad G1. The drain of the FET F4 is connected to the pad PA, its gate is connected to the pads V24, V23, V22 and V21 via the resistance R4, and its source is connected to the pad G2.

Figure 3:
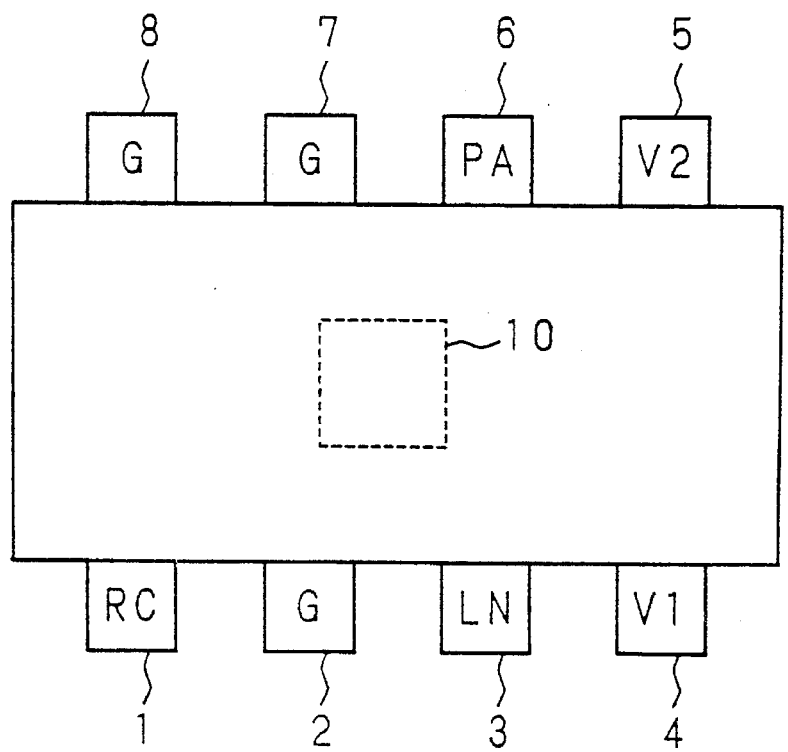
FIG. 3 is an outside plan view of the IC chip of FIG. 2 mounted in an 8-pin IC package.

FIG. 3 is an outside plan view of an IC package mounting the IC chip shown in FIG. 2, and FIG. 4 is a schematic plan view showing the bonding wires between the pads of the IC chip of FIG. 2 and the pins of an 8-pin IC package. In these figures, numerals 1 through 8 denote pins arranged in this sequence on the two opposing sides of the IC package, and the pins 1 through 8 correspond to the terminals RC, G, LN, V1, V2, PA, G and G shown in FIG. 1, respectively. An IC chip 10 is mounted approximately at the center of the IC package. In FIG. 4, numerals 11 through 18 denote inner leads made of a conductive metal disposed in the peripheral area of the IC package. The portions of the inner leads 11 through 18 extending out of the IC package are used as the pins 1 through 8. The IC chip 10 with a circuit lay out as shown in FIG. 2 is rotated by 90 degrees counterclockwise and mounted on the inner lead 9 as shown in FIG. 4.

The pad RC1 along the left side of the IC chip 10 in FIG. 4 is connected to an inner lead 11 which is made of the same metal as the pin 1 through a bonding wire 21. The pad LN along the lower side of the IC chip 10 is connected to an inner lead 13 which is made of the same metal as the pin 3 through a bonding wire 23. The pad V11 at the lower right corner of the IC chip 10 is connected to an inner lead 14 which is made of the same metal as the pin 4 through a bonding wire 24. The pad V24 along the upper right side of the IC chip 10 is connected to an inner lead 15 which is made of the same metal as the pin 5 through a bonding wire 25. The pad PA on the left side of the pad V24 is connected to an inner lead 16 which is made of the same metal as the pin 6 through a bonding wire 26. The pad G1 below the pad RC1 is connected to the inner lead 9 through a bonding wire 22. The pad G2 below the pad V24 is connected to the inner lead 9 through a bonding wire 27. The inner lead 9 is connected to an inner lead 12 which is made of the same metal as the pin 2 through two bonding wires 28 and 29, and is also connected to an inner lead 17 which is made of the same metal as the pin 7 through two bonding wires 30 and 31, and is further connected to an inner lead 18 which is made of the same metal as the pin 8 through two bonding wipes 32 and 33.

As seen, the bonding wires neither bridge over the other constituent elements nor cross each other.

Figure 5:
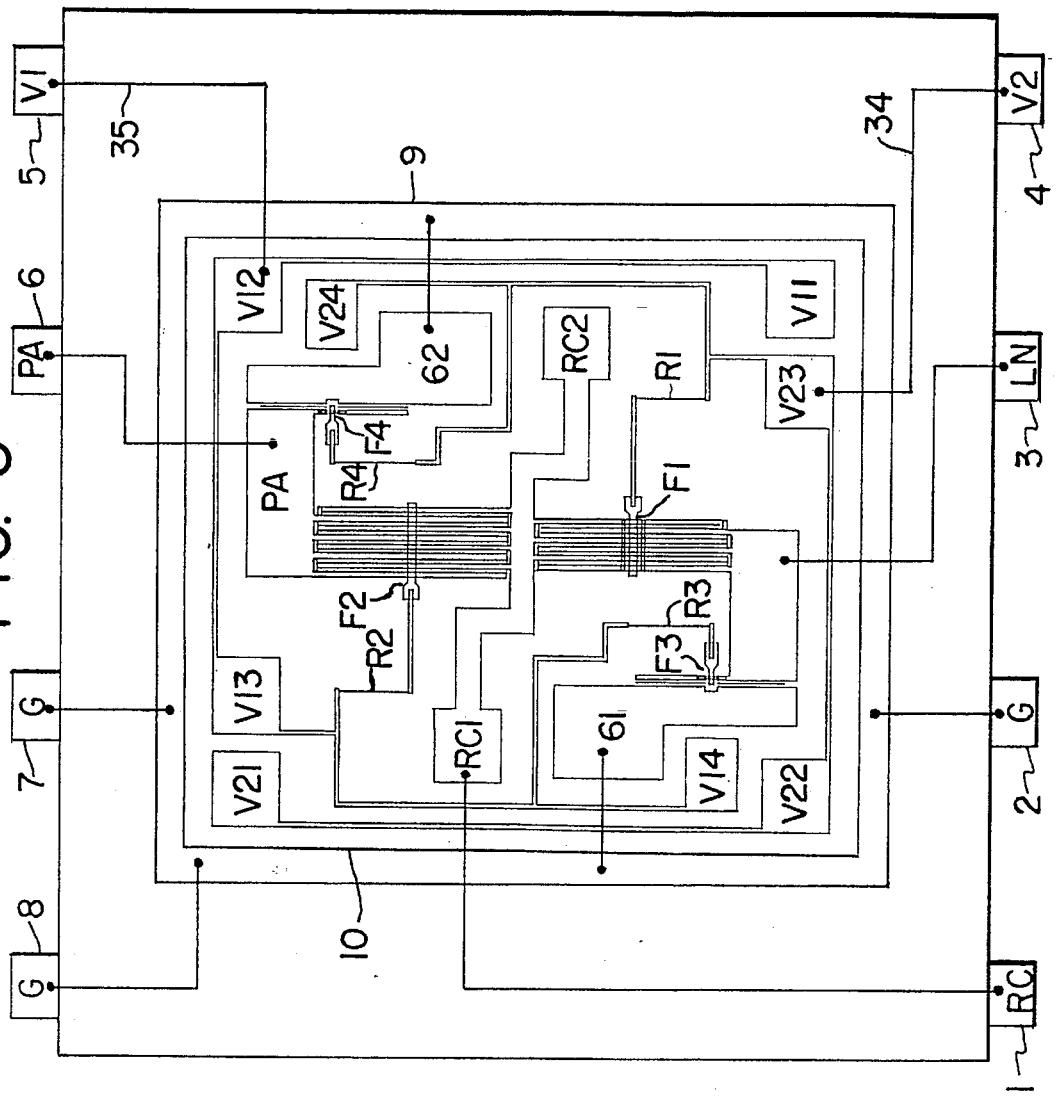
FIG. 5 is a schematic plan view of a bonding wire of another 8-pin IC package mounting the IC chip of FIG. 2.

FIG. 5 is a schematic plan view showing bonding wires between the IC chip of FIG. 2 and the pins of another 8-pin IC package. In this embodiment, the pins 4 and 5 correspond to the control voltage terminals V2 and V1 of FIG. 1, respectively, instead of the terminals V1 and V2 as in the embodiment of FIG. 4. In other words, the pins 1 through 8 correspond to the terminals RC, G, LN, V2, V1, PA, G and G shown in FIG. 1. In FIG. 5, the IC chip 10 and the inner lead 9 are magnified in view, the inner leads 11 through 18 are omitted for simplification, and the bonding wires from the pads are schematically shown to be directly connected to the pins with solid lines. As in FIG. 4, the IC chip 10 shown in FIG. 2 is rotated by 90 degrees counterclockwise and mounted on the inner lead 9.

The pad V23 along the lower right corner of the IC chip 10 is connected to the pin 4 through a bonding wire 34. The pad V12 in the upper right corner is connected to the pin 5 through a bonding wire 35. The configuration of this IC chip is the same as that shown in FIG. 4 except for the above, and like reference numerals are used to refer to like elements to omit the detailed description.

As shown in FIG. 4 and FIG. 5, the IC chip 10 of the invention can be easily applied in the different IC packages in which the configurations of the pins for applying a control voltage are mutually exchanged. Specifically in the IC chip 10 of FIG. 5, the control voltage terminals V1 and V2 are connected to the pads V12 and V23 instead of the pads V11 and V24, respectively. Also in this embodiment, the bonding wires neither stride over the other constituent elements nor cross each other.

Figure 6:
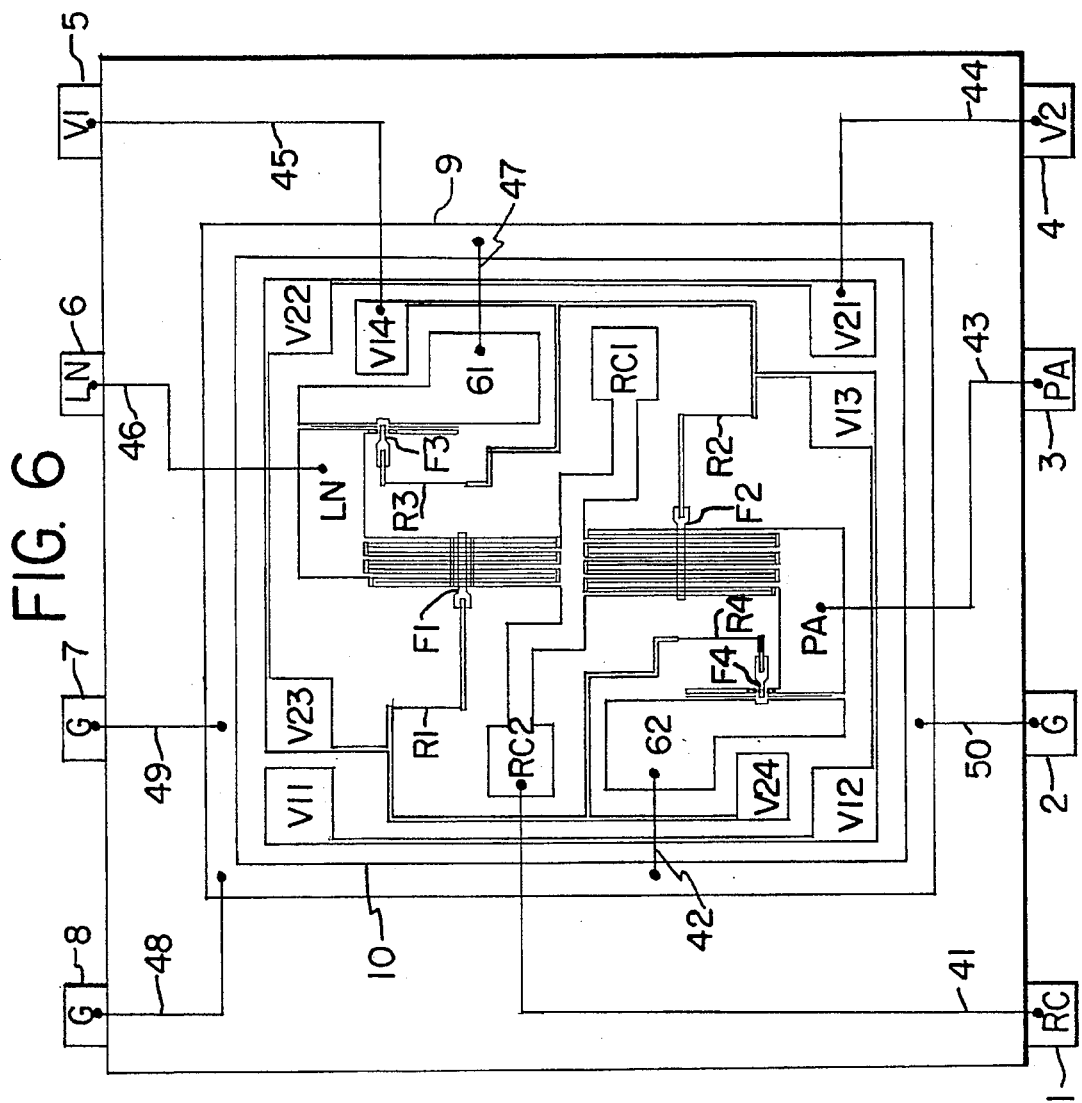
FIG. 6 is a schematic plan view of a bonding wire of still another 8-pin IC package mounting the IC chip of FIG. 2.

FIG. 6 is a schematic diagram showing the bonding wires between the IC chip of FIG. 2 and the pins of still another 8-pin IC package. As in FIG. 5, the IC chip 10 and the inner lead 9 are magnified in view, the inner leads 11 through 18 are omitted for simplification, and the bonding wires from the pads are schematically shown to be directly connected to the pins with solid lines.

The pins 1 through 8 correspond to the terminals RC, G, PA, V2, V1, LN, G and G shown in FIG. 1. In other words, the output terminal LN and the input terminal PA correspond to the pins 6 and 3, respectively, instead of the pins 3 and 6 as in FIG. 5. The IC chip 10 of FIG. 2 is rotated by 90 degrees clockwise and mounted on the inner lead 9. In other words, the IC chip 10 of FIG. 6 is mounted in the opposite direction of FIG. 5.

The pad RC2 along the left side of the IC chip 10 shown in FIG. 6 is connected to the pin 1 through a bonding wire 41. The pad PA along the lower side of the IC chip 10 is connected to the pin 3 through a bonding wire 43. The pad V21 in the lower right corner is connected to the pin 4 through a bonding wire 44. The pad V14 below the upper right corner is connected to the pin 5 through a bonding wire 45. The pad LN along the upper side of the IC chip 10 is connected to the pin 6 through a bonding wire 46. The pad G1 below the pad V14 is connected to the inner lead 9 through a bonding wire 47. The pad G2 below the pad RC2 is connected to the inner lead 9 through a bonding wire 42. The inner lead 9 is connected to the pin 2 through a bonding wire 50, and is connected to the pin 7 through a bonding wire 49, and is further connected to the pin 8 through a bonding wire 48.

Even when the configurations of the opposing pins for inputting and outputting a signal are mutually exchanged, and the gate widths of the two FETs F1 and F2 for turning ON and OFF the signal are different from each other, the IC chip 10 of the invention can be used. In such a case, the IC chip 10 is rotated by 180 degrees to be mounted in the IC package, and a respective pin is connected to one of the closest pads selected so as not to allow the bonding wires to cross each other. In this manner, as in the preceding embodiments, the bonding wires neither bridge over the other constituent elements nor cross each other.

Figure 7:
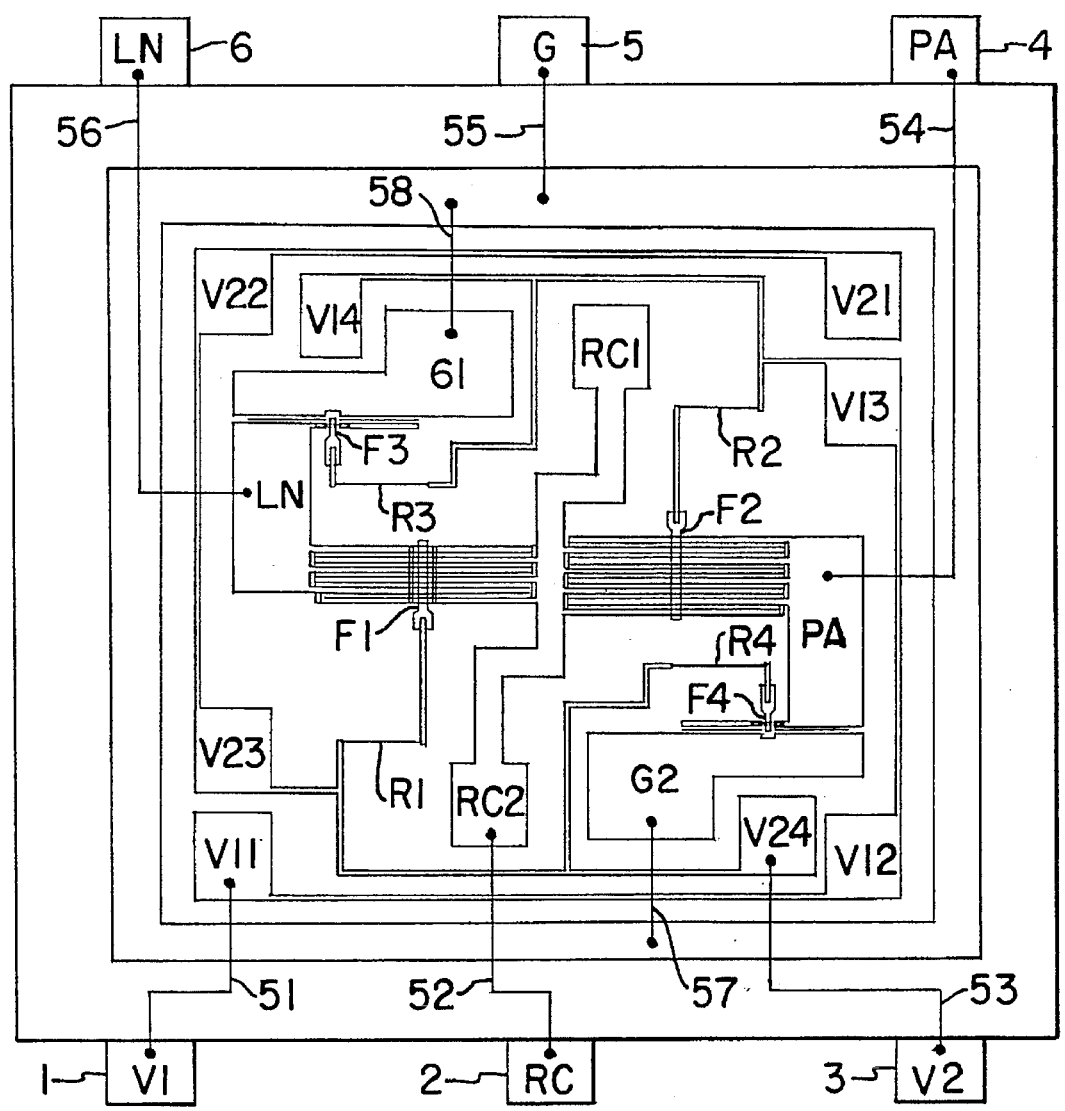
FIG. 7 is a schematic plan view of a bonding wire of a 6-pin IC package mounting the IC chip of FIG. 2.

FIG. 7 is a schematic plan view showing the bonding wires between the IC chip of FIG. 2 and the pins of a 6-pin IC package. In FIG. 7, only one pin is connected to ground, and the inner leads are omitted for simplification. The pins 1 through 6 correspond to the terminals V1, RC, V2, PA, G and LN of FIG. 1. The IC chip 10 of FIG. 2 is mounted on the inner lead 9 in the same direction as shown in FIG. 2.

The pad V11 in the lower left corner of the IC chip 10 shown in FIG. 7 is connected to the pin 1 through a bonding wire 51. The pad RC2 below the center of the IC chip 10 is connected to the pin 2 through a bonding wire 52. The pad V24 on the left side of the lower right corner of the IC chip 10 is connected to the pin 3 through a bonding wire 53. The pad PA along the right side of the IC chip 10 is connected to the pin 4 through a bonding wire 54. The pad LN along the left side of the IC chip 10 is connected to the pin 6 through a bonding wire 56. The pad G1 along the upper side of the IC chip 10 is connected to the inner lead 9 through a bonding wire 58. The pad G2 on the right side of the pad RC2 is connected to the inner lead 9 through a bonding wire 57. The inner lead 9 is connected to the pin 5 through a bonding wire 55.

Thus, the IC chip 10 can be used in a 6-pin or 8-pin IC package having various pin configurations. In such a case, the IC chip 10 is rotated by 90 degrees or 180 degrees. This rotation makes the wire bonding possible, regardless of the variety of the pin configuration.

Figure 8:
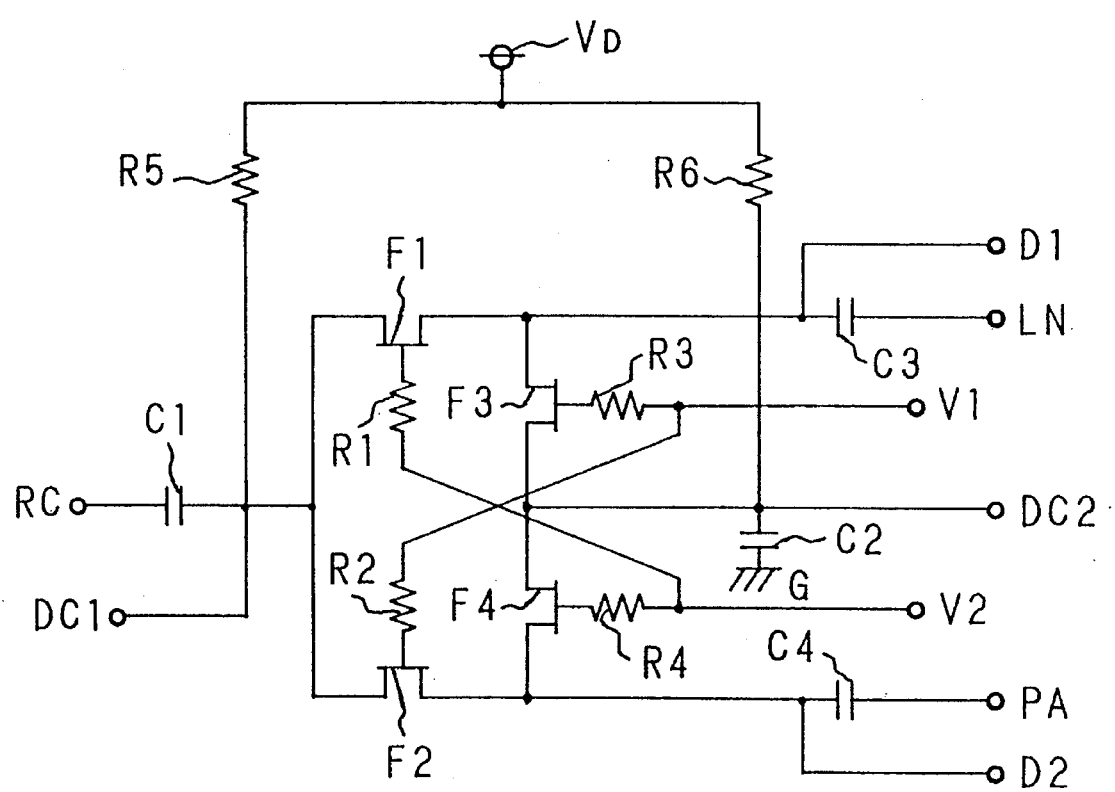
FIG. 8 is another circuit diagram of an MMIC switch.

FIG. 8 is a circuit diagram of another MMIC switch. FET F1 and FET F2 are connected to each other, and the connection point between the FETs F1 and F2 is connected to an input/output terminal RC via a capacitor C1, and also connected to a source voltage terminal VD via a resistance R5, and further to a test terminal DC1. FET F3 and FET F4 are connected to each other, and the connection point therebetween is connected to the source voltage terminal VD via a resistance R6, and also connected to a ground G via a capacitor C2, and further to a test terminal DC2. A voltage of 3 V is applied to the source voltage VD. The FET F1 and FET F3 are connected to each other, and the connection point therebetween is connected to an output terminal LN via a capacitor C3, and also connected to the test terminal D1. The FET F2 and FET F4 are connected to each other, and the connection point therebetween is connected to an input terminal PA via a capacitor C4, and further connected to a test terminal D2.

The four FETs F1, F2, F3 and F4 illustratively are all N-channel depletion type MES FETs, and are turned ON when 3 V is applied to the gates, and turned OFF when 0 V is applied. The four test terminals DC1, DC2, D1 and D2 are terminals to be used for measuring the DC characteristics of the four FETs F1, F2, F3 and F4. The configuration of this MMIC switch is the same as that shown in FIG. I except for the above differences, and the description of the common parts is omitted.

The operation of this MMIC switch is described below.

When 0 V is applied to the control voltage terminal V1, and 3 V to the control voltage terminal V2, the FET F1 is turned ON, and the FET F3 is turned OFF. A high frequency signal input from the input/output terminal RC via the capacitor C1 is output to the output terminal LN. Although the FET F2 is OFF, a slight leakage current flows, and the FET F4 is ON. As a result the signal is sent to the ground G via the capacitor C2 and is not output to the output terminal PA.

When 3 V is applied to the control voltage terminal V1, and 0 V to the control voltage terminal V2, the FET F2 is turned ON, and the FET F4 is turned OFF. The high frequency signal input from the input/output terminal PA via the capacitor C1 is output to the input/output terminal RC. Although the FET F1 is OFF, a slight leakage current flows, and the FET F3 is ON. As a result, the signal is sent to ground G via the capacitor C2 and is not output to the output terminal LN.

Figure 9:
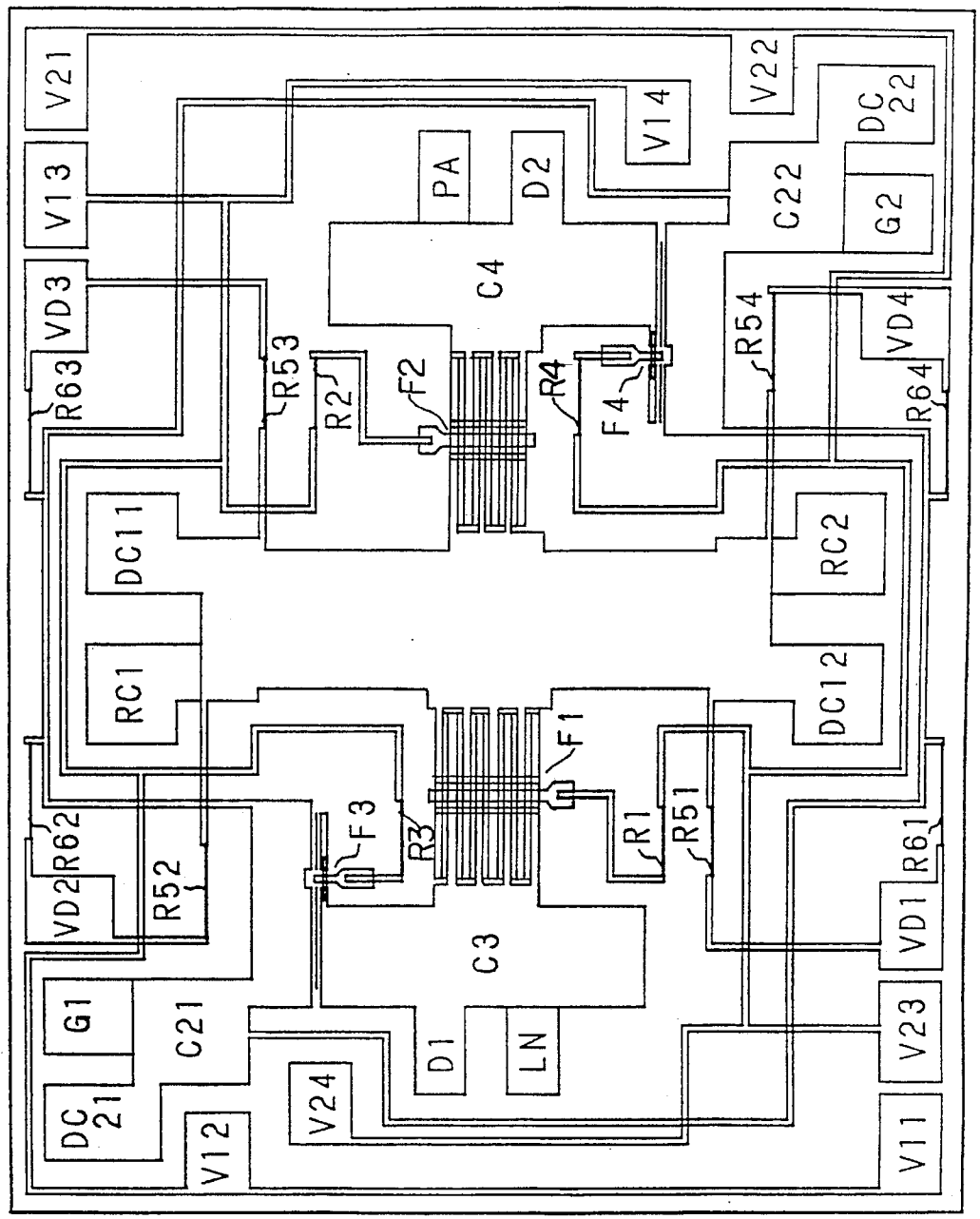
FIG. 9 is a layout diagram of an IC chip of the invention.

FIG. 9 is a layout diagram showing an IC chip of the invention used for the MMIC switch shown in FIG. 8. The location of each element is described relative to the layout shown in FIG. 9. Four pads V11, V12, V13 and V14 corresponding to the control voltage terminal V1 in FIG. 8 are disposed in the lower left corner, below the upper left corner, on the left side of the upper right corner, and above the lower right corner of the IC chip, respectively. The connection wire from the pad V11 runs upward along the left side of the IC chip to be connected to the pad V12, and further runs upward and rightward along the upper side from the upper left corner. It passes four three bending points and three branching points along the upper side and is connected to the pad V13. Then it runs downward along the right side, and passes through two bending points to be connected to the pad V14.

Four pads V21, V22, V23 and V24 corresponding to control voltage terminal V2 of FIG. 8 are disposed in the upper left corner of the IC chip, above the lower right corner (below the pad V14), on the right side of the pad V11, and below the pad V12, respectively. The connection wire from the pad V21 runs downward along the right side of the IC chip to be connected to the pad V22. It further runs downward and then leftward from the lower right corner along the lower side, and passes through four bending points and three branching points to be connected to the pad V23, then runs upward along the left side, and passes through two bending points to be connected to the pad V24. The four pads V11, V12, V13 and V14 and the connection wires therebetween are point-symmetrically to the four pads V21, V22, V23 and V24 and the connection wires therebetween about the center of the IC chip.

The four pads VD1, VD2, VD3 and VD4 corresponding to the source voltage terminal VD of FIG. 8 are disposed on the right side of the pad V23, on the right side of the upper left corner, on the left side of the upper right corner, and on the left side of the lower right corner, respectively. The pads VD1 and VD2 are point-symmetrical to the pads VD3 and VD4 about the center of the IC chip. The two pads RC1 and RC2 corresponding to the input/output terminal RC of FIG. 8 are respectively disposed slightly left of chip center along the upper side of the IC chip and slightly right of chip center along the lower side of the IC chip. Further, the pads RC1 and RC2 are disposed inside of the connection wires among the four pads V11, V12, V13 and V11 or the four pads V21, V22, V23 and V24, and inside of the connection wires between the two pads DC21 and DC22 so as to be point-symmetrical to each other about the chip center.

The two pads DC11 and DC12 corresponding to the test terminal DC1 of FIG. 8 are respectively disposed slightly to the right of chip center along the upper side of the IC chip and slightly to the left of chip center along the lower side of the IC chip. Further, the pads DC11 and DC12 are disposed inside of the connection wires among the four pads V11, V12, V13 and V14 or the four pads V21, V22, V23 and V24 and inside of the connection wires between the two pads DC21 and DC22 so as to be point-symmetrical to each other about the center.

The two pads DC21 and DC22 corresponding to the test terminal DC2 of FIG. 8 are disposed in the upper left corner and the lower right corner, respectively. The pad DC21 is connected to one pole of a capacitor C21 disposed below. One connection wire from the capacitor C21 runs downward along the left side of the IC chip, passes through three bending points, runs rightward along the lower side, passes three bending points, and is connected to the pad DC22 via one pole of a capacitor C22 disposed at the upper left position of the pad DC22. The pad D22 is connected to one pole of the capacitor C22. One connection wire therefrom runs upward along the right side of the IC chip, passes through three bending points, runs leftward along the upper side, passes through three bending points, and is connected to the pad DC21 via one pole of the capacitor C21. The pads DC21 and DC22, the capacitors C21 and C22, and the connection wires therebetween are disposed so as to be respectively point-symmetrical to each other about the center.

The two pads D1 and D2 corresponding to the test terminals D1 and D2 of FIG. 8 are disposed on the right side of the pad V24 and in the slightly upper portion along the left side of the IC chip, and on the left side of the pad V14 and in the slightly lower portion along the right side, respectively. Further, the pads D1 and D2 are disposed inside of the connection wires between the pads DC21 and DC22 so as to be point-symmetrical to each other about the center. The two pads LN and PA corresponding to the output terminal LN and the input terminal PA of FIG. 8 are respectively disposed below the pad D1 and above the pad D2 so as to be point-symmetrical to each other about the center.

The pads G1 and G2 corresponding to the ground G of FIG. 8 are respectively disposed on the right side of the pad DC21 and the left side of the pad D22 so as to be point-symmetrical to each other about the center. The pad G1 is connected to the other pole of the capacitor C21, and the pad G2 is connected to the other pole of the capacitor C22. In FIG. 9, some of the connection wires among the pads V11, V12, V13, V14, V21, V22, V23 and V24 and among the pads VD1, VD2, VD3 and VD4 appear to intersect one another, but actually they are not in contact with one another. All the pads are in contact with or in the vicinity of one of the sides of the IC chip.

When the IC chip is longitudinally and laterally divided into four equal sections, each of four resistances R51, R52, R53 and R54 and each of four resistances R61, R62, R63 and R64 are respectively disposed in each of the sections. Each of four resistances R1, R2, R3 and R4 are disposed in each of these four sections One capacitor C1 is vertically disposed in the middle of the IC chip. The two FETs F1 and F2 are disposed on one side of the capacitor C1, and the two FETs F2 and F4 are disposed on the other side of the capacitor C1. The two capacitors C21 and C22 corresponding to the capacitor C2 of FIG. 8 are disposed and connected point-symmetrically to each other about the center. The two capacitors C3 and C4 corresponding to the capacitors C3 and C4 of FIG. 8 are disposed point-symmetrically to each other about the center of the IC chip, respectively. The pads DC11, DC12, D1 and D2 are used only for testing, and not used by a user, and hence they are not bonded with any pins of the IC package. The elements are connected to one another according to the circuit diagram of FIG. 8.

Figure 10:
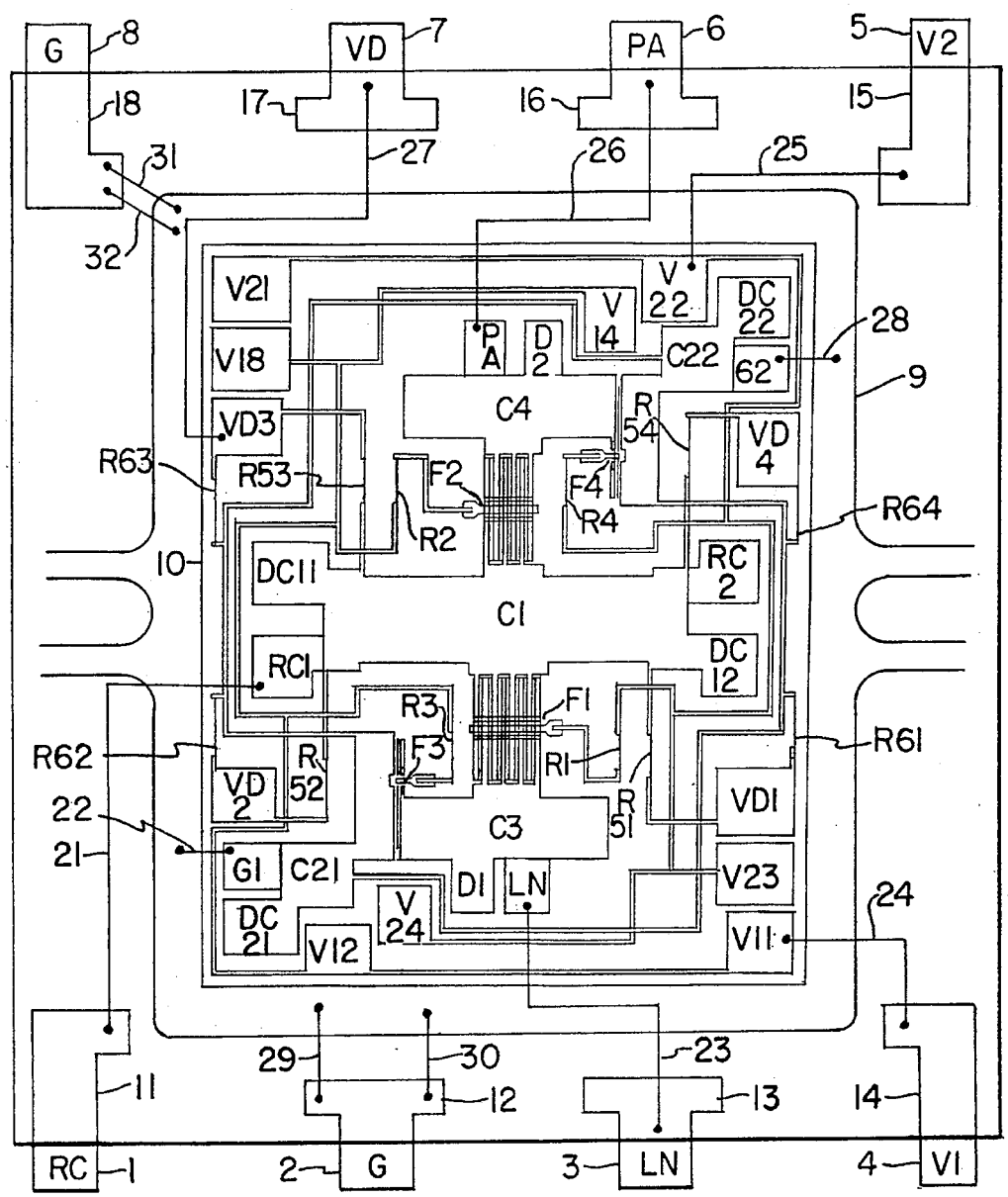
FIG. 10 is a plan view of a bonding wire connected to the IC chip of FIG. 9.

FIG. 10 is a plan view of the bonding wires the pads of the IC chip of FIG. 9 and the pins of an 8-pin IC package. The pins 1 through 8 correspond to the terminals RC, G, LN, V1, V2, PA, VD and G of FIG. 9. In FIG. 10, numerals 11 through 18 denote inner leads made of a conductive metal disposed in the peripheral part of the IC package. The portions of the inner leads 11 through 18 extending out of the IC chip are used as the pins 1 through 8 of the IC package. The IC chip 10 having a layout as shown in FIG. 9 is rotated by 90 degrees counterclockwise and mounted on the inner lead 9.

The pad RC1 positioned near the center of the left side of the IC chip 10 in FIG. 10 is connected to the inner lead 11 which is made of the same metal as the pin 1 through a bonding wire 21. The pad LN near the center of the lower side is connected to the inner lead 13 which is made of the same metal as the pin 3 through a bonding wire 23. The pad V11 located in the lower right corner of the IC chip 10 is connected to the inner lead 14 which is made of the same metal as the pin 4 through a bonding wire 24. The pad V22 on the left side of the upper right corner of the IC chip 10 is connected to the inner lead 15 which is made of the same metal as the pin 5 through a bonding wire 25. The pad PA near the center of the upper side of the IC chip 10 is connected to the inner lead 16 which is made of the same metal as the pin 6 through a bonding wire 26. The pad VD3 slightly in the chip upper portion along the left side of the IC chip 10 is connected to the inner lead 17 which is made of the same metal as the pin 7 through a bonding wire 27.

The pad G1 in the lower part along the left side of the IC chip 10 is connected to the inner lead 9 through a bonding wire 22. The pad G2 below the upper right corner of the IC chip 10 is connected to the inner lead 9 through a bonding wire 28. The inner lead 9 is connected to the inner lead 12 which is made of the same metal as the pin 2 through two bonding wires 29 and 30, and is also connected to the inner lead 18 which is made of the same metal as the pin 8 through two bonding wires 31 and 32. Thus connected bonding wires neither bridge over the other constituent elements nor cross each other.

Figure 11:
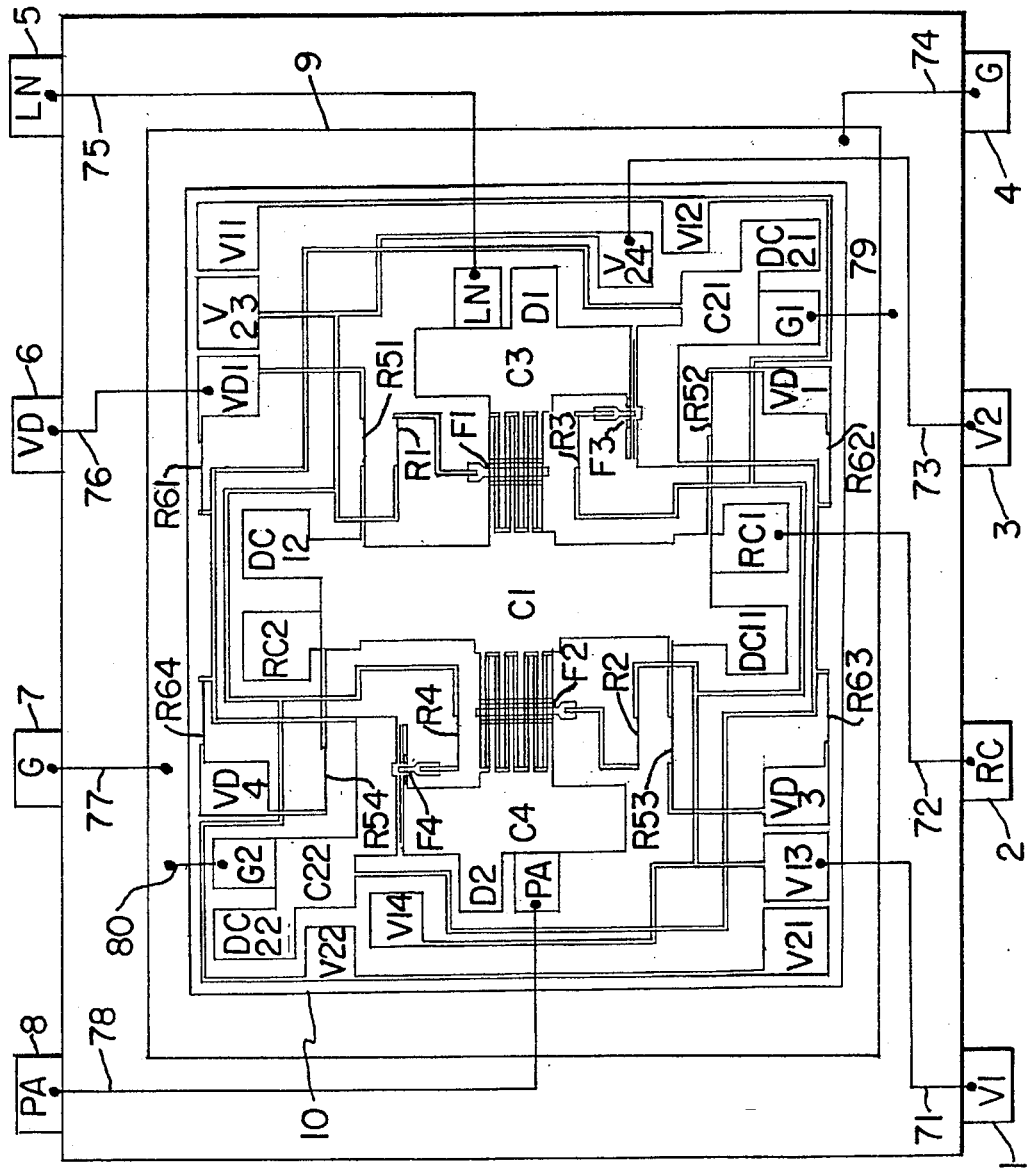
FIG. 11 is a schematic plan view of a bonding wire of another IC package mounting the IC chip of FIG. 9.

FIG. 11 is a schematic plan view showing the bonding wires between the pads of the IC chip of FIG. 9 and the pins of another 8-pin IC package. The pins 1 through 8 correspond to the terminals V1, RC, V2, G, LN, VD, G and PA shown in FIG. 9. The IC chip and inner lead 9 are magnified in view, and the inner leads 11 through 18 are omitted for simplification, and the bonding wires are schematically shown to be directly connected to the pins with solid lines. The IC chip 10 having a layout as shown in FIG. 9 is rotated by 180 degrees to be mounted on the inner lead 9.

The pad V13 on the right side of the lower left corner of the IC chip 10 is connected to the pin 1 through a bonding wire 71. The pad RC1 near the center of the lower side is connected to the pin 2 through a bonding wire 72. The pad V24 in the slightly lower portion along the right side is connected to the pin 3 through a bonding wire 73. The pad LN near the center of the right side is connected to the pin 5 through a bonding wire 75. The pad VD1 on the right side of the upper right corner is connected to the pin 6 through a bonding wire 76. The pad PA near the center of the left side is connected to the pin 8 through a bonding wire 78. The pad G1 on the left side of the lower right corner is connected to the inner lead 9 through a bonding wire 79. The pad G2 on the right side of the upper left corner is connected to the inner lead 9 through a bonding wire 80. The inner lead 9 is connected to the pin 4 through a bonding wire 74, and is also connected to the pin 7 through a bonding wire 77.

Thus, even in the case where the pin configurations of an IC package is varied or the gate widths of the FETs F1 and F2 of the IC chip are different, the IC chip of the invention can be used by properly rotating the IC chip relative to the IC package. As a result of this rotation, none of the bonding wires bridges the other constituent elements or crosses each other.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An IC chip to be connected to an IC package by bonding pads of said IC chip with pins of said IC package, comprising;

at lease four source voltage pads on the chip for supplying a source voltage wherein at least one of said source voltage pads is disposed in each of four equal sections of the IC chip formed by longitudinally and laterally dividing the IC chip;

at least one input pad for inputting a signal; and at least one output pad for outputting a signal, wherein an input pad and an output pad are disposed substantially point-symmetrically to each other about the center of the IC chip.

2. An IC chip as claimed in claim 1, further comprising:

at least four control voltage pads for supplying a control voltage, wherein at least one of said control voltage pads is disposed in each of said four equal sections of the IC chip formed by longitudinally and laterally dividing the IC chip.

3. An IC chip as in claim 2 wherein at least one each of a said source voltage pad and a said control voltage pad is disposed in each of said four sections.

4. An IC chip to be connected to an IC package by bonding pads of said IC chip with pins of said IC package, comprising:

at least four control voltage pads on the chip for supplying a control voltage, wherein at least one of said control voltage pads is disposed in each of four equal sections of the IC chip formed by longitudinally and laterally dividing the IC chip;

at least one input pad for inputting a signal; and at least one output pad for outputting a signal, wherein an input pad and an output pad are disposed substantially point-symmetrically to each other about the center of the IC chip.

5. An IC chip to be connected to an IC package by bonding pads of said IC chip with pins of said IC package, comprising:

at least four source voltage pads on the chip for supplying a source voltage, wherein at least one of said source voltage pads is disposed in each of four equal sections of the IC chip formed by longitudinally and laterally dividing the IC chip;

at least two input/output pads for inputting and outputting signals, the input/output pads being disposed substantially point-symmetrically to each other about the center of the IC chip.

6. An IC chip as claimed in claim 5 further comprising:

at least four control voltage pads for supplying a control voltage, wherein at least one of said control voltage pads is disposed in each of four equal sections of the IC chip formed by longitudinally and laterally dividing the IC chip.

7. An IC chip as in claim 6 wherein at least one each of a said source voltage pad and a said control voltage pad is disposed in each of said four sections.

8. An IC chip to be connected to an IC package by bonding pads of said IC chip with pins of said IC package, comprising:

at least four control voltage pads on the chip for supplying a control voltage, wherein at least one of said control voltage pads is disposed in each of four equal sections of the IC chip formed by longitudinally and laterally dividing the IC chip;

at least two input/output pads for inputting and outputting signals, wherein the input/output pads are disposed substantially point-symmetrically to each other about the center of the IC chip.

9. An IC chip to be connected to an IC package by bonding pads of said IC chip with pins of said IC package, comprising:

at least four source voltage pads on the chip for supplying a source voltage, wherein at least one of said source voltage pads is disposed in each of four equal sections of the IC chip formed by longitudinally and laterally dividing the IC chip; and at least four control voltage pads for supplying a control voltage, wherein at least one of said control voltage pads is disposed in each of four equal sections of the IC chip formed by longitudinally and laterally dividing the IC chip.

10. An IC chip as in claim 9 wherein at least one each of a said source voltage pad and a said control voltage pad is disposed in each of said four sections.

11. An IC chip to be connected to an IC package by bonding pads of said IC chip with pins of said IC package, comprising:

at least one input pad for inputting a signal;

at least one output pad for outputting a signal;

at least two input/output pads for inputting and outputting signals;

at least four source voltage pads for supplying a source voltage, wherein an input pad and an output pad are disposed substantially point-symmetrically to each other about the center of the IC chip, and the input/output pads are disposed substantially point-symmetrically to each other about the center of the IC chip, and at least one of the source voltage pads is disposed in each of four equal sections of the IC chip formed by longitudinally and laterally dividing the IC chip.

12. An IC chip as claimed in claim 11, further comprising:

at least four control voltage pads for supplying a control voltage, wherein at least one of said control voltage pads is disposed in each of four sections of said IC chip formed by longitudinally and laterally dividing said IC chip.

13. An IC chip as in claim 12 wherein at least one each of a said source voltage pad and a said control voltage pad is disposed in each of said four sections.

14. An IC chip to be connected to an IC package by bonding pads of said IC chip with pins of said IC package, comprising:

at least four source voltage pads on the chip for supplying a source voltage, wherein at least one of said source voltage pads is disposed in each of four equal sections of the IC chip formed by longitudinally and laterally dividing the IC chip; and means on said IC chip for electrically connecting all of said at least four source voltage pads.

15. An IC chip to be connected to an IC package by bonding pads of said IC chip with pins of said IC package, comprising:

at least four control voltage pads on the chip for supplying a control voltage, wherein at least one of said control voltage pads is disposed in each of four equal sections of the IC chip formed by longitudinally and laterally dividing the IC chip; and means on said IC chip for electrically connecting all of said at least four control voltage pads.

16. An IC chip to be connected to an IC package by bonding pads of said IC chip with pins of said IC package, comprising:

at least one input pad for inputting a signal;

at least one output pad for outputting a signal;

at least two input/output pads for inputting and outputting signals; and at least four control voltage pads for supplying a control voltage, wherein an input pad and an output pad are disposed substantially point-symmetrically to each other about the center of the IC chip, two input/output pads are disposed substantially point-symmetrically to each other about the center of the IC chip, and at least one of said control voltage pads is disposed in each of four equal sections of the IC chip formed by longitudinally and laterally dividing said IC chip.

* * * * *